(12) United States Patent
Vora

(10) Patent No.: US 10,139,436 B2
(45) Date of Patent: *Nov. 27, 2018

(54) METHOD AND SYSTEM FOR A WIDEBAND CMOS RMS POWER DETECTION SCHEME

(71) Applicant: Entropic Communications LLC, Carlsbad, CA (US)

(72) Inventor: Sameer Vora, Carlsbad, CA (US)

(73) Assignee: Entropic Communications LLC, Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/696,055

(22) Filed: Sep. 5, 2017

(65) Prior Publication Data

US 2017/0363665 A1 Dec. 21, 2017

Related U.S. Application Data

(63) Continuation of application No. 15/164,496, filed on May 25, 2016, now Pat. No. 9,753,065, which is a continuation of application No. 13/539,922, filed on Jul. 2, 2012, now Pat. No. 9,354,260, which is a continuation of application No. 12/407,506, filed on Mar. 19, 2009, now Pat. No. 8,212,546.

(60) Provisional application No. 61/038,261, filed on Mar. 20, 2008.

(51) Int. Cl.
*G01R 21/10* (2006.01)
*H03G 3/30* (2006.01)

(52) U.S. Cl.
CPC ........... *G01R 21/10* (2013.01); *H05K 999/99* (2013.01); *H03G 3/3036* (2013.01)

(58) Field of Classification Search
None
See application file for complete search history.

(56) References Cited

U.S. PATENT DOCUMENTS

| | | | |
|---|---|---|---|
| 6,472,912 B1 | 10/2002 | Chiu et al. | |
| 7,395,036 B2 | 7/2008 | Akamine et al. | |
| 7,612,588 B2 | 11/2009 | Kimura | |
| 7,623,839 B2 * | 11/2009 | Miyashita | H03D 7/1441 455/323 |
| 8,212,546 B2 * | 7/2012 | Vora | G01R 21/10 324/76.11 |
| 9,354,260 B2 * | 5/2016 | Vora | G01R 21/10 |
| 9,753,065 B2 * | 9/2017 | Vora | G01R 21/10 |
| 2006/0066404 A1 | 3/2006 | Akamine et al. | |

(Continued)

*Primary Examiner* — Jermele M Hollington
(74) *Attorney, Agent, or Firm* — McAndrews, Held & Malloy

(57) ABSTRACT

A system includes a first circuit and a second circuit. The first circuit includes a first MOS transistor having a gate and a drain. The first circuit is configured to receive a radio frequency (RF) signal at the gate of the first MOS transistor. The drain of the first MOS transistor is configured to output a first current that is proportional to the square of the input voltage of the RF signal while receiving the RF signal. The second circuit includes a second MOS transistor having a source configured to receive a first current from the first circuit. The second MOS transistor is biased in a triode region and has a channel resistance between the source and a drain. The second circuit is configured to output a voltage proportional to the value of the power of the RF signal received by the first circuit.

20 Claims, 7 Drawing Sheets

(56) References Cited

U.S. PATENT DOCUMENTS

2007/0024333 A1    2/2007   Suzuki
2011/0062996 A1    3/2011   Chang et al.
2011/0102047 A1    5/2011   Sun et al.

\* cited by examiner

METHOD AND SYSTEM FOR A WIDEBAND CMOS RMS POWER DETECTION SCHEME

CROSS-REFERENCE TO RELATED APPLICATIONS

This application is a continuation of application Ser. No. 15/164,496 filed on May, 25, 2016, now U.S. Pat. No. 9,753,065, which is a continuation of application Ser. No. 13/539,922 filed on Jul. 2, 2012, now. U.S. Pat. No. 9,354,260, which is a continuation of application Ser. No. 12/407,506 filed on Jun. 19, 2009, now U.S. Pat. No. 8,212,546, which makes reference to and claims priority to U.S. Provisional Application Ser. No. 61/038,261 filed on Mar. 20, 2008, each of which is hereby incorporated herein by reference in its entirety.

FIELD OF THE DISCLOSURE

The disclosure relates to semiconductor MOS circuits, and more specifically, the disclosure relates to a semiconductor CMOS squaring circuit.

BACKGROUND

Squaring circuits produce an output voltage that is proportional to the square of an input voltage and can be useful to detect the root mean squared (RMS) power contained in the envelope of a modulated signal. Squaring circuits may be used in the automatic gain control (AGC) implementation for a TV tuner or any receiver having a variable gain amplifier. Additionally, squaring circuits may be used in the AGC loop to detect and control the output power from a transmitter. Conventional circuits for power detectors rely on bipolar transistors or Schottky diodes for RMS power detection. These conventional circuits cannot be easily integrated with commonly used CMOS technology in the form of a monolithic integrated circuit and thus MOS squaring circuits are desirable.

One true squaring circuit that is well know includes a pair of dual-ended difference amplifiers that each receives an input signal, a pair of dual-to-single-ended converters that receive the respective dual-ended output of the difference amplifiers, and a summing network for summing the squares of the outputs of the dual-to-single-ended converters to suppress signal dependent error terms from being output. While this circuit is useful for squaring a balanced input, it is susceptible to fabrication process dependent variations that affect the accuracy of the output and thus cannot be sued in applications requiring less than 1 dB accuracy.

A squaring detector based on the square-law property of a pair of MOS transistors is also known. In this detector, the gate of one of the MOS transistors is excited by the input signal and the gate of the other MOS transistor is kept biased at a constant voltage. The difference in the drain currents of this MOS pair is then used to detect the power level of the input signal. This approach is also susceptible to fabrication process dependent variations that affect the accuracy of the output and thus it cannot be used in applications requiring less than 1 dB accuracy.

Accordingly, an improved RMS power detection circuit is desirable.

SUMMARY

In one embodiment of the disclosed method and apparatus, a system comprises a first circuit including a first MOS transistor having a gate and a drain. The first circuit is configured to receive a radio frequency (RF) signal at the gate of the first MOS transistor. The drain of the first MOS transistor is configured to output a first current proportional to the square of the input voltage of the RF signal while receiving the RF signal. A DC bias current is subtracted from the first current by the first circuit. A second circuit is connected to the first circuit. The second circuit includes a second MOS transistor having a source configured to receive the first current from the first circuit. The second MOS transistor is biased in a triode region and has a channel resistance between the source and a drain. The second circuit is configured to output voltage proportional to the value of the power of the RF signal received by the first circuit. The output voltage is a function of the first current and the channel resistance between the source and the drain of the second MOS transistor.

In another embodiment, a method of detecting the power of an RF signal comprises (a) receiving an RF signal having a voltage at a first circuit, (b) applying the voltage of the RF signal across a gate--source of a MOS transistor to generate a first current that is proportional to the square of the voltage of the RF signal, (c) generating a second current in a second circuit that is proportional to the square of the voltage of the RF signal minus a DC bias current of the first MOS transistor of the RF signal, (d) receiving the second current at a source of the second MOS transistor, and (e) outputting a voltage from the second circuit. The second MOS transistor is biased in a triode region and has a channel resistance between the source and a drain. The output voltage is proportional to the value of the power of the RF signal received by the first circuit, and the second voltage is a function of the second current and the channel resistance between the source and the drain of the second MOS transistor.

DETAILED DESCRIPTION

Figure 1:
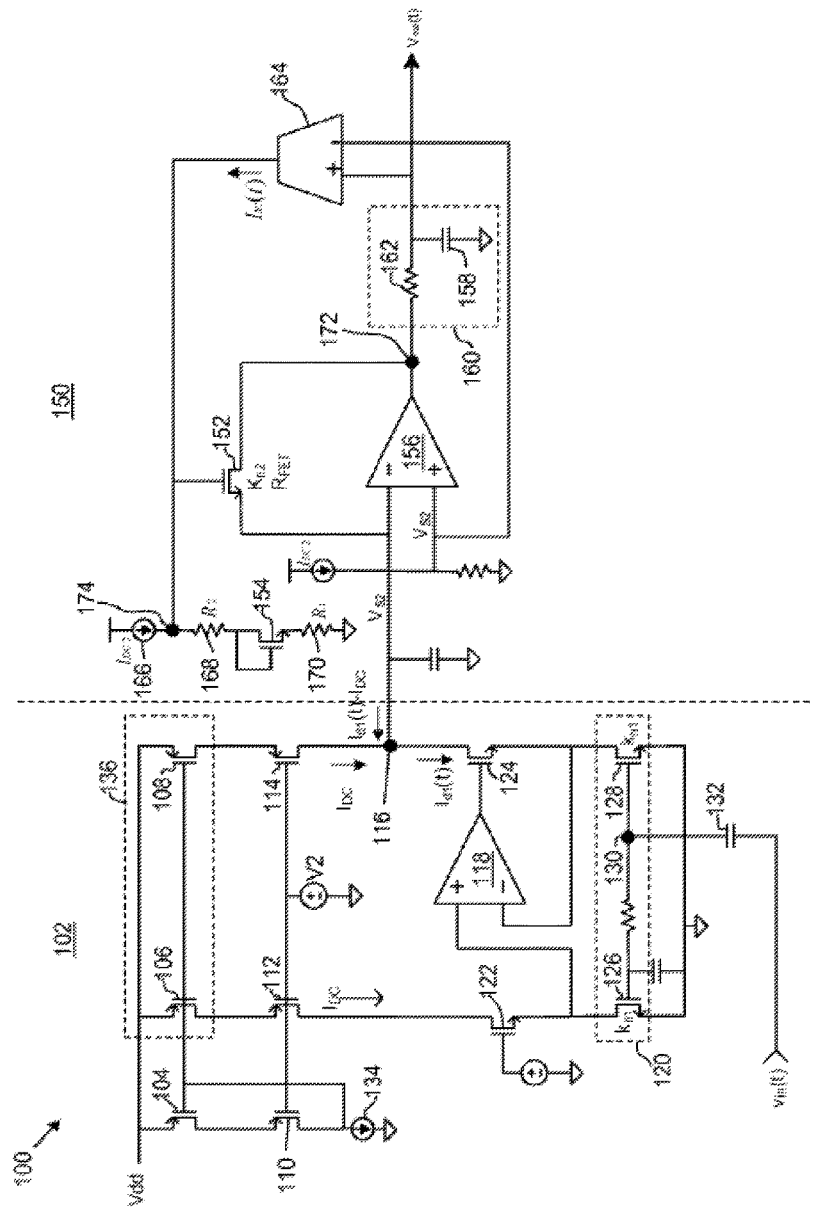
FIG. 1 illustrates one embodiment of an RMS power detection circuit.

FIG. 1 illustrates one embodiment of a radio frequency (RF) root mean squared (RMS) power detection circuit 100 configured to output a signal having a voltage that is proportional to the power of a received RF signal. The RMS power detection circuit 100 may be incorporated in an automatic gain control (AGC) to determine the power of an incoming RF signal or in a circuit configured to determine the transmission power of a transmitter. RMS power detection circuit 100 includes a sensing circuit 102 having a node 116 connecting the sensing circuit to a post-amplifier ("post-amp") circuit 150.

The sensing circuit 102 includes a first current mirror 136 and a second current mirror 120. First current mirror 136 includes MOS transistors 106 and 108, and is configured to generate a DC bias current, $I_{DC}$, from the drains of the MOS transistors 106 and 108. Note that the following description of MOS transistors may refer to both NMOS and PMOS transistors. The sources of MOS transistors 104, 106, and 108 are coupled to a DC voltage source, Vdd. The drains of MOS transistors 104, 106, and 108 are coupled to the sources of MOS transistors 110, 112, and 114. The gates of MOS transistors 104, 106, and 108 are coupled to the drain of MOS transistor 110, which is also coupled to current source 134. The gates of MOS transistors 110, 112, and 114 are connected to each other and to reference voltage V2. Reference voltage V2 may be generated by implementing a diode connected to a MOS transistor and serves to maintain transistors 110, 112, and 114 biased in saturation. The drains of MOS transistors 112 and 114 are connected to the second current mirror 120 through MOS transistors 122 and 124. One skilled in the art will understand that current mirrors 120 and 136 may be implemented in different configurations.

Current mirror 120 includes MOS transistors 126 and 128. Current mirror 120 is configured to ensure that the DC drain current of MOS transistor 128 is equal to the drain current of MOS transistor 108, which is $I_{DC}$. The drains of MOS transistors 122 and 124 are connected to the sources of MOS transistors 112 and 114, respectively. The sources of MOS transistors 122 and 124 are connected to the drains of MOS transistors 126 and 128, respectively, as well as being coupled to the input terminals of operational amplifier ("op-amp") 118. The output terminal of op-amp 118 is connected to the gate of MOS transistor 124. This arrangement equalizes the drain voltage of transistors 128 and 126 and allows the use of short channel devices. The sources of MOS transistors 126 and 128 are connected to ground. The gate of MOS transistor 128 is connected to node 130, which receives the RF input signal having a voltage $V_{in}(t)$ through capacitor 132. When the voltage of the RF signal $V_{in}(t)$ is sufficiently large, the current flowing from the drain of MOS transistor 128 increases to $I_{d1}(t)$.

Sensing circuit 102 is connected to postamp circuit 150 at node 116. Postamp circuit 150 includes an op-amp 156 having an input terminal connected to node 116. Postamp circuit 150 also includes a MOS transistor 152, which is disposed within the feedback loop of op-amp 156. The feedback loop of op-amp 156 maintains node 116 at a nominal DC voltage of $V_{S2}$ as shown in FIG. 1. MOS transistor 152 may be selected so that it remains biased in the triode region. In some embodiments, MOS transistors 152 and 128 are formed by the same process to reduce process dependent variables that may detrimentally affect the output of circuit 100, as explained in greater detail below. The gate of MOS transistor 152 is connected to a bias correction loop that includes transconductance amplifier 164, current source 166, resistors 168 and 170, and MOS transistor 154. Transconductance amplifier 164 is configured to output a current that is proportional to the output voltage $V_{out}(t)$ of RF power detection circuit 100. This output current is fed into the biasing circuitry of MOS transistor 152. Connecting the gate of MOS transistor 152 to the bias correction loop ensures that the resistance of the MOS transistor 152 varies in a manner that compensates the fabrication process induced variations that may affect transistor 128. Note that in some embodiments the gate of MOS transistor 152 may be connected to different biasing circuitry that maintains MOS transistor 152 biased in the triode region.

The drain of MOS transistor 152 may be connected to low-pass filter 160 that includes a resistor 162 and capacitor 158. The values of resistor 162 and capacitor 158 may be selected to provide the desired low-pass filtering such that unwanted high-frequency components present in the signal at node 172 will be filtered from the output signal. In some embodiments, low-pass filter 160 can be implemented as a higher order or active filter. Additionally, the low-pass filter 160 may be implemented in different configuration and be located between node 116 and op-amp 156. The bandwidth and frequency response of the low-pass filter 160 may be made programmable to handle various modulation schemes.

Figure 2:
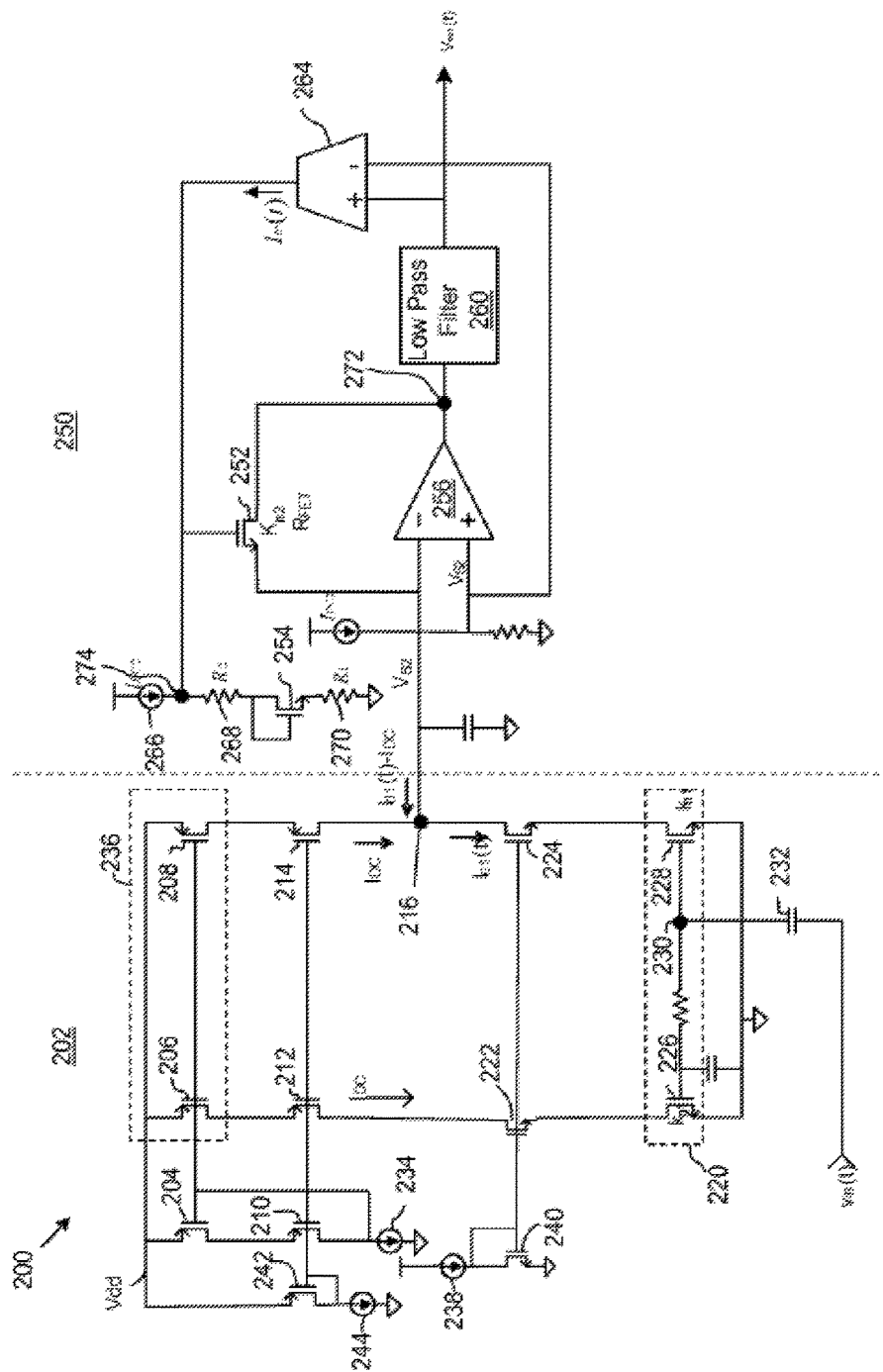
FIG. 2 illustrates another embodiment of an RMS power detection circuit.

FIG. 2 illustrates another embodiment of an RMS power detection circuit 200, wherein like items are indicated by reference numerals having the same value as in FIG. 1, increased by 100. The descriptions of these corresponding items are not repeated. As shown in FIG. 2, the gates of MOS transistors 222 and 224 are connected to the gate of MOS transistor 240. The gate of MOS transistor 240 is also connected to the drain of MOS transistor 240 and a current source 238. The gates of MOS transistors 210, 212, and 214 are connected to the gate of MOS transistor 242. The source of MOS transistor 242 is connected to power supply Vdd, and the drain of MOS transistor 242 is connected to a current source 244.

Figure 3:
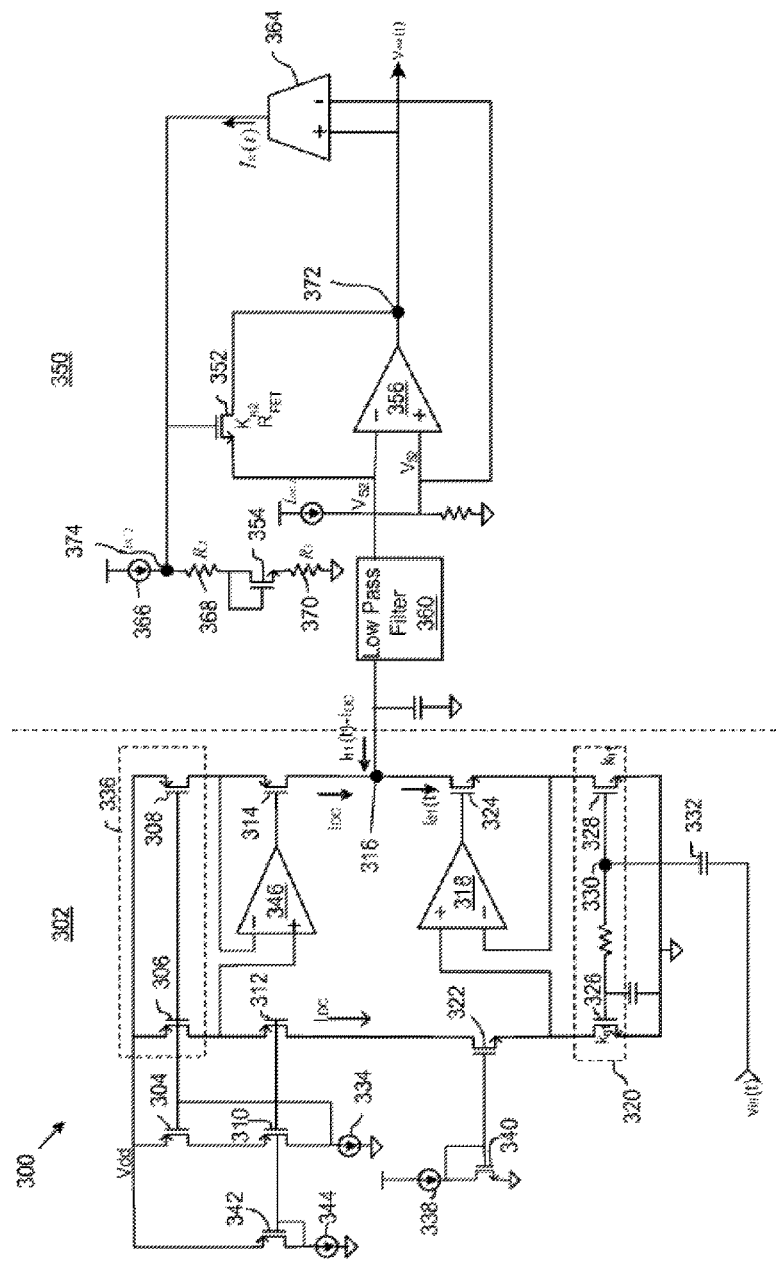
FIG. 3 illustrates yet another embodiment of an RMS power detection circuit.

FIG. 3 illustrates another embodiment of an RMS power detection circuit 300, wherein like items are indicated by reference numerals having the same value as in FIGS. 1 and 2, increased by 200 and 100, respectively. The descriptions of these corresponding items are not repeated. As shown in FIG. 3, the gate of MOS transistor 314 is connected to the output terminal of op-amp 346. One of the input terminals of op-amp 346 is connected between the source of MOS transistor 312 and the drain of MOS transistor 306. The other input terminal of op-amp 346 is connected the source of MOS transistor 314 and the drain of MOS transistor 308.

With reference to FIG. 1, the operation of the RMS power detection circuit 100 is now described. An RF signal having a voltage $V_{in}(t)$ is received by RMS power detection circuit 100 at node 130 through capacitor 132.

$V_{in}(t)$ is a modulated RF carrier having the form:

$$V_{in}(t) = A(t)\cos(\omega_c t + \phi(t)) \quad \text{Eq. (1)}$$

Where A(t) denotes the modulation envelope of the carrier.

The RF input signal is applied across the gate and source of MOS transistor 128. When the voltage $V_{in}(t)$ is sufficiently large, a current $I_{d1}(t)$ flows from the drain of MOS transistor 128. The value of the drain current for the MOS transistor in saturation can be written as:

$$I_{d1}(t) := \frac{K_{n1}}{2} \cdot (V_{GS1}(t) - V_T)^2 \quad \text{Eq. (2)}$$

Where, $$K_{n1} := \frac{1}{2} \cdot \mu_n \cdot C_{ox} \cdot \frac{W_1}{L_1}$$

$V_{GS1}(t)$ is the gate-source voltage of MOS transistor 128;
$V_T$ is the threshold voltage of MOS transistor 128;
$C_{ox}$, is the capacitance of the oxide layer per unit area of the MOS transistor 128;
$\mu_n$ is the charge carrier effective mobility of MOS transistor 128; and
$W_1$ and $L_1$ are the width and length of the gate of MOS transistor 128, respectively.

Note that although the above equations may not hold true for all short channel devices, the current density is low enough such that the transistors do not operate in velocity saturation and the equations are close approximations of the actual values. The gate-source voltage of MOS transistor 128, $V_{GS1}(t)$, includes an AC component and a DC component as shown by the following equation:

$$V_{GS1}(t)=V_{GS1}+V_{in}(t) \quad \text{Eq. (3)}$$

Where $V_{GS1}$ is the DC bias.

Substituting Equation (3) into Equation (1) yields:

$$I_{d1}(t) := \frac{K_{n1}}{2} \cdot (V_{GS1} + v_{in}(t) - V_T)^2 \quad \text{Eq. (4)}$$

Multiplying out Equation (4) yields:

$$I_{d1}(t) := \quad \text{Eq. (5)}$$
$$\frac{K_{n1}}{2} \cdot (V_{GS1} - V_T)^2 + K_{n1} \cdot (V_{GS1} - V_T) \cdot v_{in}(t) + \frac{K_{n1}}{2} \cdot (v_{in}(t))^2$$

Accordingly, the current flowing from the drain of MOS transistor 128, $I_{d1}(t)$, includes the desired square law component, $(V_{in}(t))^2$, as well as unwanted high-frequency components and the DC component $V_{GS1}$. The high-frequency components are present in the signal $V_{in}(t)$ and thus are also present in $V_{in}(t)^2$. The DC bias current, $I_{DC}$, is removed at node 116 where current mirrors 136 and 120 are connected to postamp circuit 150. Since current mirrors 120 and 136 meet at node 116, the difference between $I_{d1}(t)$ and $I_{DC}$ flows from postamp circuit 150. Accordingly, the current that flows into postamp circuit 150 is equal to $I_{d1}(t)-I_{DC}$, which, as shown in Equation (6) below, does not include the DC bias current $I_{DC}$.

$$Iout(t) = I_{d1}(t) - I_{DC} = K_{n1}(V_{GS1} - V_T)v_{in}(t) - \frac{K_{n1}}{2}vin^2(t) \quad \text{Eq. (6)}$$

Substituting Equation (1) into Equation (6) provides:

$$Iout(t) = K_{n1}(V_{GS1} - V_T)A(t)\cos(\omega_c t + \phi(t)) - \quad \text{Eq. (7)}$$
$$\frac{K_{n1}}{4}A^2(t)(1 + \cos(2\omega_c t + 2\phi(t)))$$

In this manner, sensing circuit 102 removes the unwanted DC component from the received RF signal. The current that flows into postamp circuit 150 flows into MOS transistor 152. MOS transistor 152 may be implemented as a triode region NMOS embedded within the feedback loop of op-amp buffer 156. In the triode region, MOS transistor 152 acts like a resistor having a channel resistance $R_{FET}$. Implementing MOS transistor 152 as a triode region NMOS enables the MOS transistor 152 to compensate for process and temperature variations in the RF detector circuit 100 thereby reducing the detrimental effects these variations. Additionally, forming MOS transistors 128 and 152 by the same process enables the resistance value of $R_{FET}$ to be proportional to the transconductance of MOS transistor 128 to further reduce process and temperature variations in the RMS power detection circuit 100. The resistance of MOS transistor 152, $R_{FET}$, may be approximated by the following equation:

$$R_{FET} := \frac{1}{K_{n2} \cdot (V_{GS2} - V_T - V_{DS}(t))} \quad \text{Eq. (8)}$$

Where $V_{DS}(t)$ is the voltage between the drain and source of MOS transistor 152.

Since MOS transistor 152 is implemented in the feedback loop of op-amp 156, the output voltage of RF power detector circuit 100, $V_{out}(t)$, is equal to the current flowing through MOS transistor 152, $I_{out}(t)$, multiplied by the value of the channel resistance of MOS transistor 152, $R_{FET}$, plus a DC bias of $V_{S2}$.

$$V_{DS}(t)=V_{out}(t)-V_{S2}=(I_{d1}(t)-I_{DC})R_{FET}=I_{out}(t)R_{FET} \quad \text{Eq. (9)}$$

$V_{out}(t)$ is a function of $V_T$, and is thus process dependent. In one embodiment, $V_{out}(t)$ is made independent of process variations by generating $V_{GS2}$ as a function of $V_{out}(t)$ and $V_T$. As shown in FIG. 1, the gate of MOS transistor 152 is connected to a correction loop that includes transconductance amplifier 164, resistors 168 and 170, current source 166, and MOS transistor 154. Transconductance amplifier 164 has an input terminal connected to $V_{out}(t)$ and another to an input terminal of op-amp buffer 156. The output of transconductance amplifier 164 is connected to the gate of MOS transistor 152. The gate of MOS transistor 152 is also connected to node 174 located between current source 166 and resistor 168. The voltage across resistor 168 is equal to $V_{offset}$, the value of which is a constant selected to minimize the error value, $V_{dsat3}$, as explained below. The gate of MOS transistor 154 is connected between the source of MOS transistor 154 and resistor 168. The voltage across resistor 170 is equal to $V_{S2}$, the value of which is also selected to maintain transistor 152 biased in the triode region. $V_{S2}$ is also equal to the source voltage of MOS transistor 152.

Accordingly, the gate-source voltage, $V_{GS2}$, of MOS transistor 152 is equal to:

$$V_{GS2}:=(R_1+R_2)\cdot(I_{DC2}+I_{tc}(t))+V_{GS3}-V_{S2} \quad \text{Eq. (10)}$$

Where, $I_{tc}(t)$ is the current flowing from the output of the transconductance amplifier;

$V_{GS3}$ is the gate-source voltage of transistor 154;

$R_1$ and $R_2$ are the resistances of resistors 168 and 170; and $I_{DC2}$ is the bias current of current source 166.

Noting the following:

$$I_{tc}(t) := \frac{V_{out}(t) - V_{S2}}{R_1 + R_2};$$

$$V_{S2} := I_{DC2} \cdot R_1; \text{ and}$$

$$v_{GS3} := V_T + V_{dsat3}$$

Then, Equation (10) may be simplified to:

$$V_{GS2}:=V_{offset}+V_T+V_{dsat3}+V_{out}(t)-V_{S2} \quad \text{Eq. (11)}$$

Where, $V_{offset}$ equals $I_{DC2}R_2$

Using the value of $V_{GS2}$, as determined in Equation (11), and $V_{DS}(t)$, as determined in Equation (9), returns the following equation:

$$R_{FET} := \frac{1}{K_{n2} \cdot (V_{dsat3} + V_{offset})} \quad \text{Eq. (12)}$$

Where $V_{dsat3}$ is an error value.

As described above, the output voltage of the RMS power detection circuit 100, $V_{out}(t)$, is equal to $I_{out}(t)$ multiplied by $R_{FET}$ plus $V_{S2}$, where $I_{out}(t)$ is equal to the current that passes through the source and drain of MOS transistor 152 and low-pass filter 160. Low-pass filter 160 is designed to remove unwanted high frequency components at frequencies ω and 2ω contained in the received RF signal, $V_{in}(t)$. The values of resistor 162 and capacitor 158 may be selected to provide an additional desired amount of filtering to the squared envelope $A^2(t)$ with an integration time constant $T_{filt}$. To determine the effect of low-pass filter 160 on the output voltage, Equations (6) and (12) are first substituted into Equation (9) to get $V_{out}(t)$ after low-pass filtering as:

$$V_{out}(t) - V_{S2} := \frac{K_{n1}}{4 \cdot T_{filt} K_{n2} \cdot V_{offset} \left(1 + \frac{V_{dsat3}}{V_{offset}}\right)} \cdot \int_{t-T_{filt}}^{t} A(t)^2 dt \quad \text{Eq. (13)}$$

As shown by Equation 13, the circuit may be designed such that $V_{offset} \gg V_{dsat3}$ so that the error value $V_{dsat3}$ has little effect on the output voltage. The value of $V_{out}(t) - V_{S2}$ in Equation 13 is proportional to the RMS power contained in the envelope $A(t)$ of the incoming RF signal. This value is nearly independent of process to the first degree assuming $V_{offset} \gg V_{dsat3}$ since the ratio $K_{n1}/K_{n2}$ is process and environment independent if transistors 128 and 152 are fabricated on the same semiconductor die. Accordingly, the voltage output by RF power detection circuit 100 is proportional to the power of the received RF signal and is virtually free from process and temperature dependent variations of the RF power detection circuit 100. RF detector circuit 100 is accurate to less than 1 dB when receiving an RE signal having an input power between −10 dBm to −15 dBm in 0.18 μm CMOS.

In some applications, the input power of the RF signal received at the gate of MOS transistor 128 will be less than −15 dBm, and thus the signal will either be too small to be detected by circuit 102, or higher order errors that may still remain in the circuit may be too big relative to the output signal and negatively affect the accuracy of the circuit. In some applications, a technology other than 0.18 μm CMOS may be used resulting in a different usable power range than from −10 dBm to −15 dBm. In some applications, the input power of the RF signal may be above −10 dBm and either cause MOS transistor 152 to fall out of the triode region, or cause the gate voltage of MOS transistor 152 to rise above constraints imposed by the circuit power supply.

Figure 5:
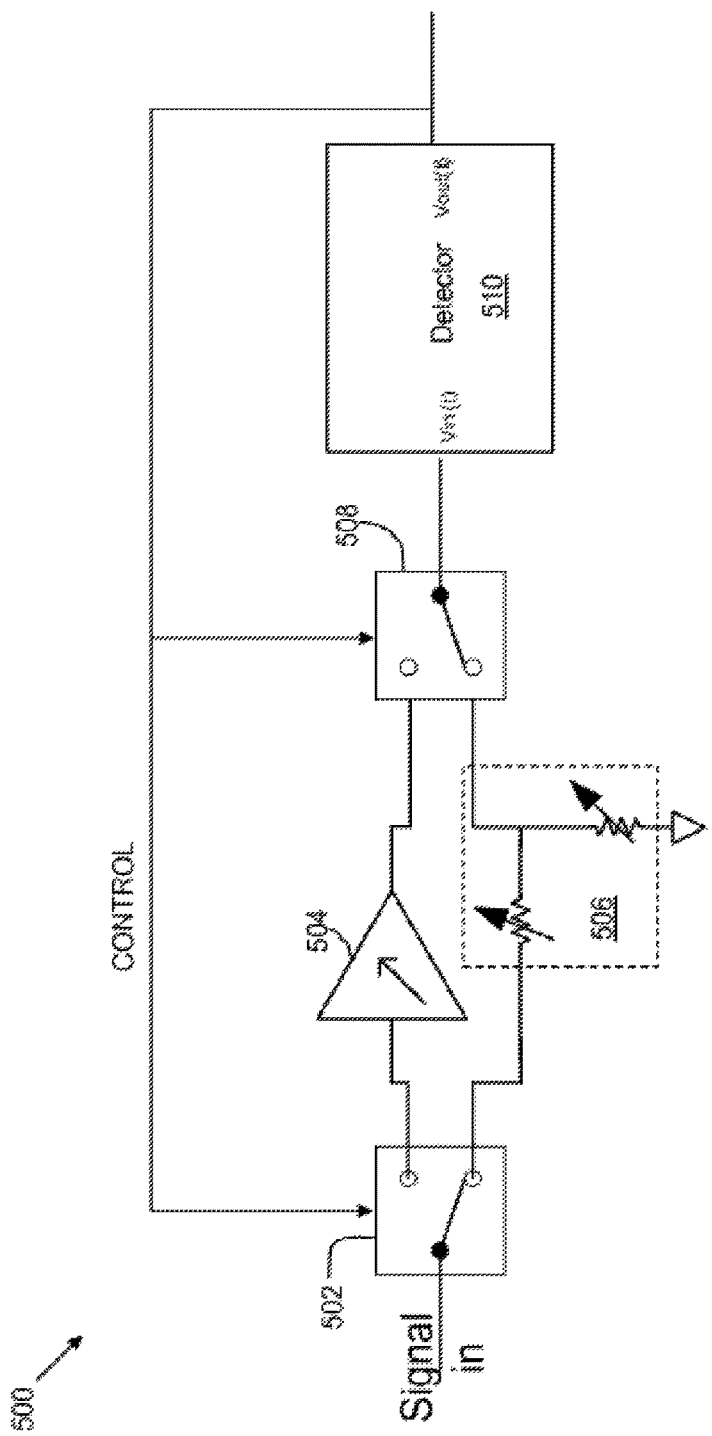
FIG. 5 illustrates one example of pre-processing circuitry connected to an RMS power detection circuit.

In these applications, an RMS power detection circuit 100 may be connected to power-shifting circuitry that is configured to increase or decrease the power of the received RF signal so it is within the optimal power range for an RMS power detection circuit 100. FIG. 5 illustrates one embodiment of power-shifting circuitry 500 connected to RMS power detection circuit 510. Power-shifting circuitry 500 includes switches 502 and 508, programmable gain amplifier 504, and a programmable attenuator 506. Switches 502 and 508 are configured to selectively couple RF power detection circuit 510 to the programmable gain amplifier 504 or to the programmable attenuator 506 depending on the power of the received RF signal.

In some applications, the RMS power detection circuit 510 will sense an input signal if the input power is above or below a known threshold power within a reasonable range window on either size of the threshold. In these applications, the gain or attenuation of the signal before the RMS power detection circuit 510 can be set based on the known threshold power. For example, if the threshold power of the detector is above −10 dBm, then switches 502 and 508 will couple the input of RMS power detector circuit 510 to programmable attenuator 506, which will attenuate the power of the incoming signal till the attenuated threshold power falls within the optimal range of detection. Alternatively, if the threshold power of the input signal is below −15 dBm, then switches 502 and 508 will be switched to couple the input terminal of RMS power detector circuit 510 to the programmable amplifier 504, which will raise the amplified threshold power of the circuit to fall within the optimal range. If the threshold power of the input signal is within the range of RMS power detection circuit 510, e.g., −10 dBm to −15 dBm, then programmable amplifier 504 may act as a buffer with a gain of 1, and thus pass the input signal without amplifying or attenuating the signal.

Figure 7:
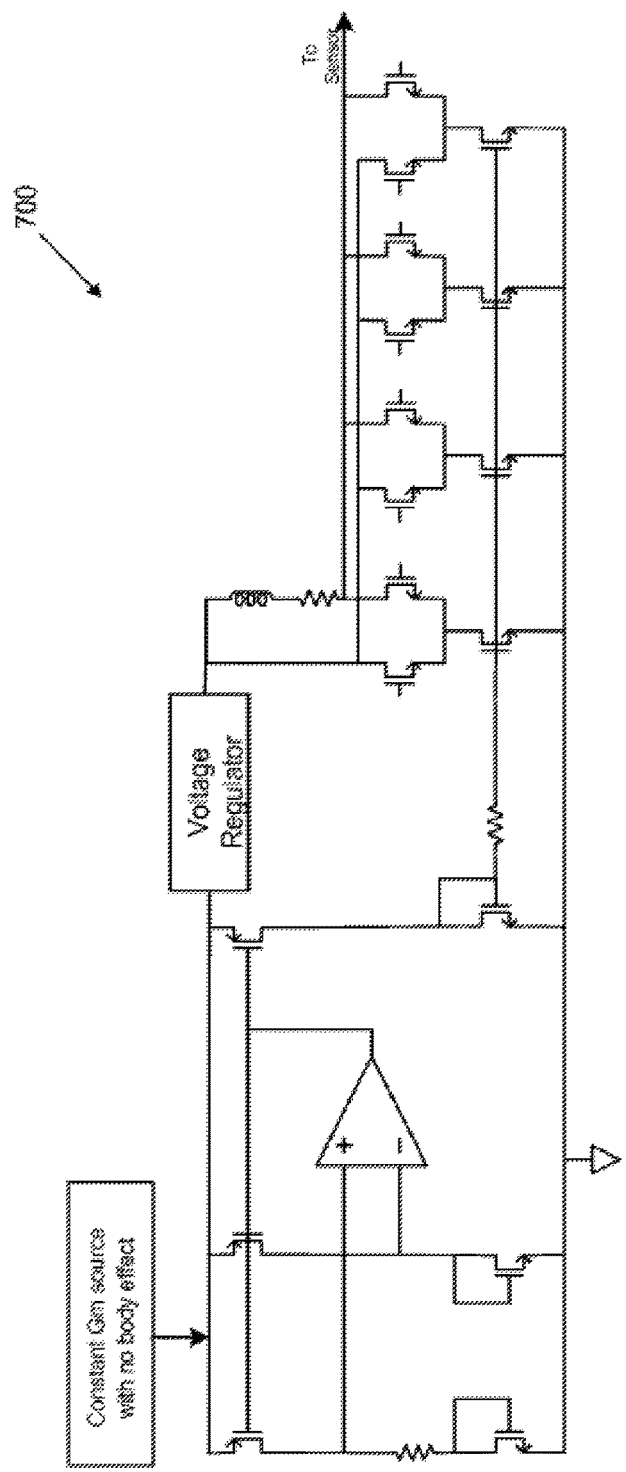
FIG. 7 illustrates one embodiment of a preamplifier that may be implemented in the pre-processing circuitry illustrated in FIG. 5.

In some embodiments, an RMS power detection circuit may be connected to a preamplifier to increase its sensitivity. FIG. 7 illustrates one embodiment of a preamplifier 700 that may be connected to the input of an RMS power detection circuit. Preamplifier 700 provides a flat response over the entire band of interest. The preamplifier 700 achieves the response by biasing a MOS transistor with a constant gm/Rint current and running the output into the same load resistor so that process, voltage, and temperature (PVT) variations are cancelled out. The constant gm-bias may be generated using a circuit configured to remove the body effect of the transistors. The frequency roll-off of this circuit is equalized by shunt-peaking using a load inductor. Note that various types of load inductors may be implemented to equalize the frequency roll-off. In some embodiments, a regulator is implemented to power the preamplifier 700 to maintain a constant impedance from the power supply in the desired frequency band.

RMS power detection circuit in accordance with the embodiments shown in FIGS. 1-3 may still have fixed errors in its output that are induced by mismatched devices that form the RMS power detector. These errors may be removed by calibrating the output of RMS power detection circuit. The calibration may be implemented by digitizing the output of the RMS power detection circuit, storing the output voltage of the RMS power detection circuit when the circuit is not receiving an input RF signal, and subtracting the stored output voltage from the output voltage of the RMS power detection circuit when the circuit is receiving an RF signal.

Figure 6:
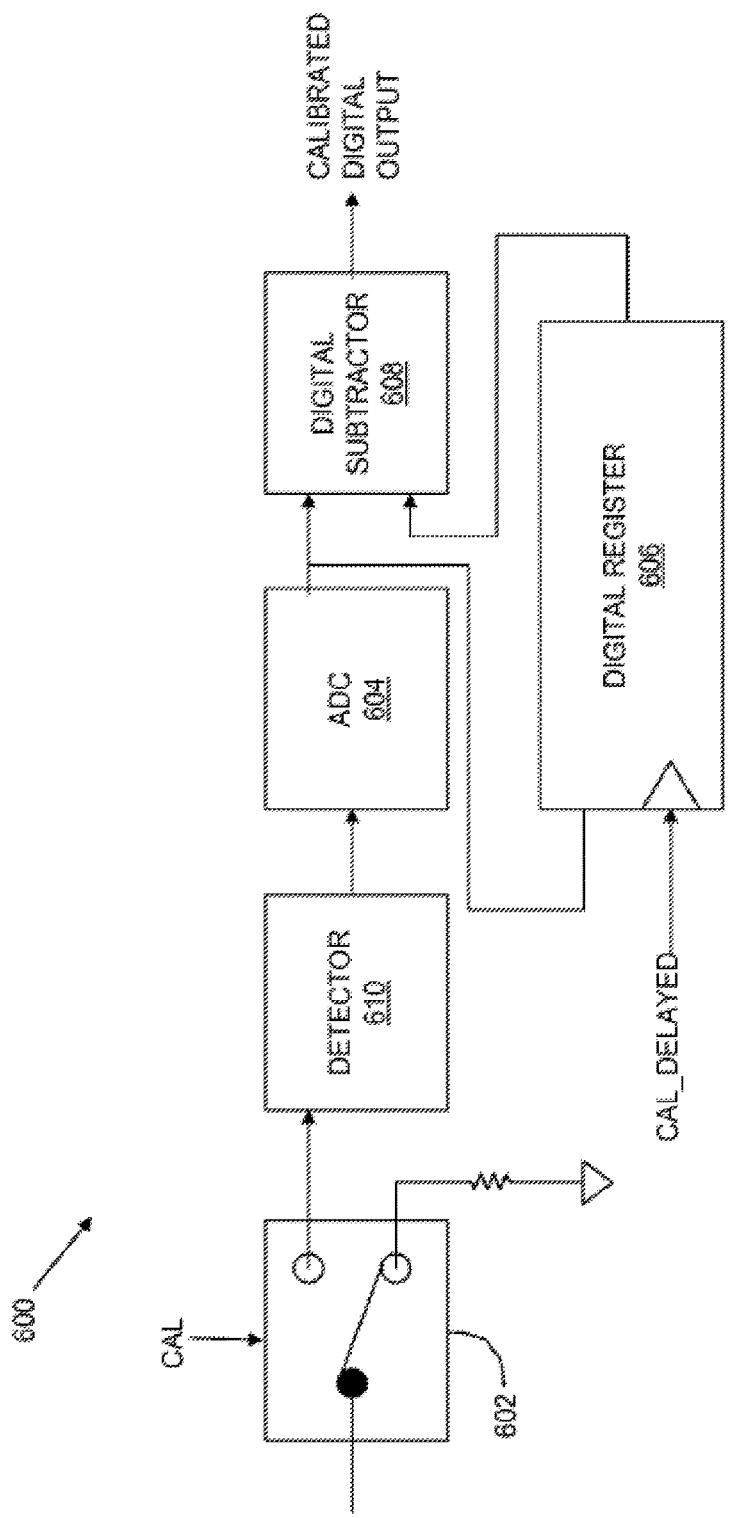
FIG. 6 illustrates one embodiment of calibration circuitry that may be connected to an RMS power detection circuit.

FIG. 6 illustrates one example of a calibration circuit that may be connected to an RMS detection circuit 600. As shown in FIG. 6, calibration circuit 610 includes a switch 602 coupled to the input of the RMS power detection circuit 610, an analog to digital converter (ADC) 604 connected to the output of RMS power detection circuit 610, and a digital subtractor 608 connected to the output of the ADC 604. A digital register 606 is coupled between the output of ADC 604 and the input of the digital subtractor 608.

To calibrate the output of the RMS power detection circuit 610, switch 602 disconnects the input of RMS power detection circuit 610 from receiving an RF input signal when the signal CAL is either a logic high or a logic low. With the RMS power detection circuit 610 not receiving an input RF signal, the output of RMS power detection circuit 610 is converted from an analog signal to a digital signal at ADC 604. The output of the RMS power detection circuit 610, when it is not receiving an input RF signal, will be equal to the errors in the circuit created by the mismatch of the components forming RMS power detection circuit 610. The digital signal from ADC 604 is output to digital register 606, which stores this error value when the CAL_DELAYED is signal is received at digital register 606.

Once the error values of output of RMS power detector circuit 610 is stored in digital register 606, the CAL signal transitions from high-to-low or low-to-high and changes the orientation of switch 602 thereby connecting the input of RMS detection circuit 610 to receive an input RF signal. As described above, RMS power detection circuit 610 outputs a signal proportional to the input RMS power of the received RF signal. This output voltage is converted to a digital signal at ADC 604. The digital signal is received at digital subtractor 608 where the stored error signal is subtracted from the digital signal output from ADC 604. After subtraction, the digital subtractor 608 outputs a calibrated signal that does not include errors derived from the mismatch of devices that form the RMS power detection circuit 610.

Figure 4:
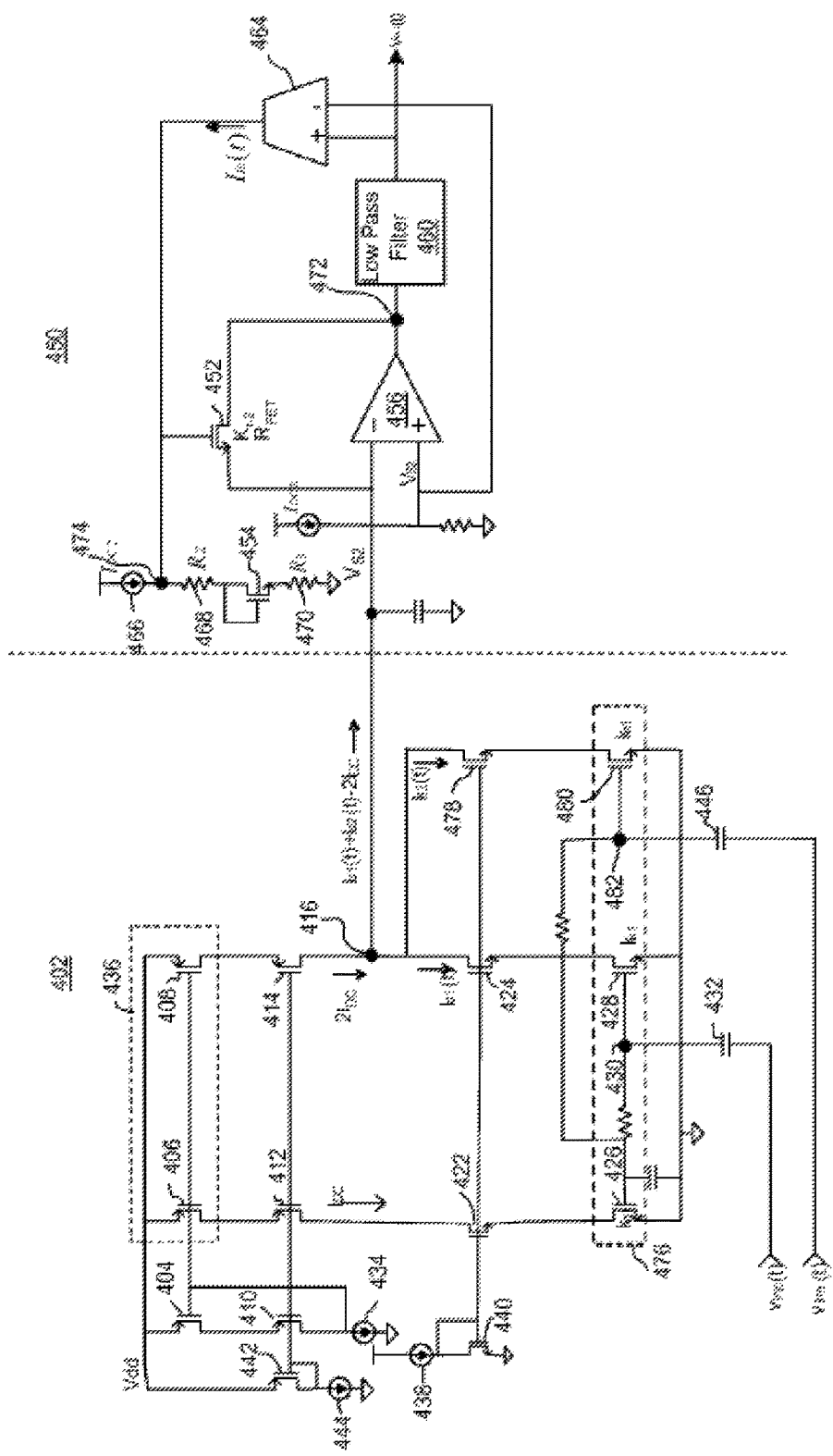
FIG. 4 illustrates a differential embodiment of an RMS power detection circuit.

FIG. 4 illustrates a differential embodiment of an RMS power detection circuit 400, wherein like items are indicated by reference numerals having the same value as in FIGS. 1, 2, and 3, increased by 300, 200, and 100, respectively. RMS power detection circuit 400 receives a balanced RF input at nodes 430 and 482. An RF signal $V_{inp}(t)$ is received across the gate-source of MOS transistor 428 through capacitor 432, and an input signal $V_{inm}(t)$ is received across the gate-source of MOS transistor 480 through capacitor 446. Both $V_{inp}(t)$ and $V_{inm}(t)$ are modulated RF carriers having the form of Equation (1) above. Note that $V_{inp}(t)$ and $V_{inm}(t)$ will be out of phase with one another.

When the voltages of $V_{inp}(t)$ and $V_{inm}(t)$ are sufficiently large, currents $I_{d1}(t)$ and $I_{d2}(t)$ will flow from the drains of MOS transistors 428 and 480, respectively. The value of the drain currents for MOS transistors 428 and 480 in saturation can be written as the identified in Equation (2) above. Accordingly, currents flowing from the drains of MOS transistors 428 and 480 may be written as:

$$I_{d1}(t) := \frac{K_{n1}}{2} \cdot (V_{GS1} - V_T)^2 + K_{n1} \cdot (V_{GS1} - V_T) \cdot v_{inp}(t) + \frac{K_{n1}}{2} \cdot (v_{inp}(t))^2 \quad \text{Eq. (14)}$$

$$I_{d2}(t) := \frac{K_{n1}}{2} \cdot (V_{GS1} - V_T)^2 + K_{n1} \cdot (V_{GS1} - V_T) \cdot v_{inm}(t) + \frac{K_{n1}}{2} \cdot (v_{inm}(t))^2 \quad \text{Eq. (15)}$$

Where, $I_{d1}(t)$ is the current flowing from the drain of MOS transistor 428; and $I_{d2}(t)$ is the current flowing from the drain of MOS transistor 480.

MOS transistor 408 of current mirror 436 is designed such that it is twice as large as MOS transistor 406 and thus the DC bias current flowing from the drain of MOS transistor 408 is twice the DC bias current flowing from the drain of MOS transistor 406. MOS transistors 426, 428, and 480 are also arranged as a current mirror with the drains of MOS transistors 428 and 480 connected to the drain of MOS transistor 414 at node 416. Since current mirrors 436 and 476 are connected at node 416, the difference $I_{d1}(t)+I_{d2}(t)$ and $2I_{DC}$ flows into postamp circuit 450.

Accordingly, the current that flows into postamp circuit 450 is equal to $I_{d1}(t)+I_{d2}(t)-I_{DC}$, which as shown in Equation (16), below, does not include the DC bias current $2I_{DC}$:

$$I_{d1}(t) + I_{d2}(t) = \quad \text{Eq. (16)}$$
$$2 \cdot I_{DC} := 2 \cdot \left[\frac{K_{n1}}{2} \cdot (V_{GS1} - V_T)^2\right] - 2 \cdot I_{DC} + K_{n1} \cdot (V_{GS1} - V_T) \cdot$$
$$(v_{inp}(t) - v_{inm}(t)) + \frac{K_{n1}}{2} \cdot [(v_{inp}(t))^2 + (v_{inm}(t))^2]$$

Since $V_{inp}(t)$ and $V_{inm}(t)$ are differential and out of phase, the voltage of the two signals are equal and opposite, e.g., $V_{inp}(t)=-V_{inm}(t)$. The current $I_{DC}$ may be expressed as:

$$I_{DC} := \frac{K_{n1}}{2} \cdot (V_{GS1} - V_T)^2 \quad \text{Eq. (17)}$$

Substituting Equation (17) into Equation (16) yields:

$$I_{d1}(t)+I_{d2}(t)-2 \cdot I_{DC} := K_{n1} \cdot [(v_{inp}(t))^2] \quad \text{Eq. (18)}$$

As shown in Equation (18), the current flowing into postamp circuit 450 is single ended, as the term $V_{inm}(t)$ has been removed. Further processing of the signal in postamp circuit 450 is carried out as described above with respect to FIG. 1.

Atlthough the systems and methods have been described in terms of examples, it is not limited thereto. Rather, this disclosure should be construed broadly, to include other variants and embodiments of the systems and methods, which may be made by those skilled in the art without departing from the scope and range of equivalents of the system and method. Delimiters used in the claims—such as 'a)' and 'i)'—should not be taken as imputing any order to the claims, but rather are provided only to serve as visual cues to add in the parsing of the claims and as identifiers in the event that a particular portion of the claim is to be later referenced.

What is claimed is:

1. A system comprising:
    a first circuit comprising a first metal oxide semiconductor (MOS) transistor having a gate for receiving a radio frequency (RF) signal via a capacitor and having a drain for outputting a first current that is proportional to a square of a voltage of the RF signal in response to receiving the RF signal; and
    a second circuit connected to the first circuit, the second circuit comprising a second MOS transistor having a source for receiving the first current from the first circuit,
        wherein the second circuit outputs a voltage proportional to a power of the RF signal received by the first circuit, the output voltage being a function of the first current and a channel resistance of the second MOS transistor.

2. The system of claim 1, comprising a correction loop connected to a gate of the second MOS transistor and to an output of the second circuit for maintaining the second MOS transistor biased in a triode region.

3. The system of claim 2, wherein the correction loop varies a voltage applied to the gate of the second MOS transistor based in part on the output voltage of the second circuit.

4. The system of claim 2, wherein the second circuit comprises a low-pass filter connected to one of a drain or a source of the second MOS transistor, the low-pass filter removing a high-frequency component from the received RF signal.

5. The system of claim 1, wherein the second MOS transistor is disposed within a feedback loop of an operational amplifier buffer having an input coupled to an output of the first circuit.

6. The system of claim 1, wherein the first and second circuits have respective configurations such that the output voltage of the second circuit is proportional to the power of the RF signal received by the first circuit regardless of process variations within a range of process variations of a process that forms the first and second circuits.

7. The system of claim 1, wherein the first circuit comprises a first current mirror comprising the first MOS transistor.

8. The system of claim 7, wherein the first circuit comprises a second current mirror for generating a DC bias current to be subtracted from the first current.

9. The system of claim 1, wherein the first circuit comprises a pre-amplifier for increasing the voltage of the RF signal.

10. The system of claim 1, wherein the first circuit includes an attenuator for attenuating the voltage of the RF signal.

11. The system of claim 1, comprising a calibration circuit connected to the first and second circuits for removing an error voltage from the output voltage of the second circuit.

12. A method of detecting the power of an RF signal, comprising:
generating a first current proportional to a square of a voltage of the RF signal in response to receiving the RF signal at a gate of a metal oxide semiconductor (MOS) transistor of a first circuit;
generating a second current in a second circuit, the second current being proportional to the square of the voltage of the RF signal;
receiving the second current at a source of a second MOS transistor; and
outputting a second voltage from the second circuit, the second voltage being proportional to a power of the RF signal received by the first circuit and being a function of the second current and a channel resistance of the second MOS transistor.

13. The method of claim 12, comprising filtering the output voltage through a low-pass filter to remove a high-frequency component.

14. The method of claim 12, wherein generating a second current comprises: i) generating a DC bias current in the first circuit; and ii) subtracting the DC bias current from the first current at a first node.

15. The method of claim 12, comprising amplifying the received RF signal prior to receiving the RF signal at the gate of the first MOS transistor.

16. The method of claim 12, comprising attenuating the received RF signal prior to receiving the RF signal at the gate of the first MOS transistor.

17. The method of claim 12, comprising applying a bias voltage at a gate of the second MOS transistor to maintain the second MOS transistor in a triode region, wherein the bias voltage is based in part on a threshold voltage of the second transistor.

18. The method of claim 17, wherein the bias voltage is based in part on a threshold voltage of the second MOS transistor.

19. The method of claim 12, comprising calibrating the output voltage of the second circuit.

20. The method of claim 19, wherein the calibrating comprises: i) storing the output voltage of the second circuit in a register when the first circuit is not receiving an RF signal; and ii) subtracting the stored output of the second circuit from an output voltage of the second circuit when the first circuit is receiving an RF signal.

* * * * *